(12) United States Patent
Hirota et al.

(10) Patent No.: US 6,300,186 B1
(45) Date of Patent: *Oct. 9, 2001

(54) METHOD OF MEASURING SEMICONDUCTOR DEVICE

(75) Inventors: Toshiyuki Hirota; Shuji Fujiwara, both of Tokyo (JP)

(73) Assignee: NEC Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/637,038

(22) Filed: Apr. 24, 1996

(30) Foreign Application Priority Data

Apr. 27, 1995 (JP) .................................. 7-103760

(51) Int. Cl.[7] ............................................... H01L 21/8242
(52) U.S. Cl. .......................... 438/239; 438/253; 438/254; 438/396; 438/397; 438/743; 438/756
(58) Field of Search .......................... 257/308; 438/254, 438/396, 397, 743, 756, FOR 212, 253, 239

(56) References Cited

U.S. PATENT DOCUMENTS 3,669,775 * 6/1972 Porter .................................. 438/756
3,751,314 * 8/1973 Rankel ................................ 438/756

(List continued on next page.)

FOREIGN PATENT DOCUMENTS 5539634   3/1980  (JP) ............................. H01L/21/302
58204540  11/1983 (JP) ............................. H01L/21/306

(List continued on next page.)

OTHER PUBLICATIONS

Hossain, Sylvia D., Michael F. Pas. "Heated SC1 Solution for Selective Etching and Resist Particulate Removal, " Journal of Electrochemical Society, vol. 140, No. 12, Dec. 1993; pp. 3604–3606.*

Ghandi, Sorab k., VLSI Fabrication Principles: Silicon and Gallium Arsenide, 2nd edition; p. 649, 1994.*

(List continued on next page.)

*Primary Examiner*—Carl Whitehead, Jr.
*Assistant Examiner*—Toniae M. Thomas
(74) *Attorney, Agent, or Firm*—Hayes, Soloway, Hennessey, Grossman & Hage PC (57) ABSTRACT

There is provided a method of manufacturing a semiconductor device having a MOS transistor formed on a silicon substrate, and a stacked capacitor constituted by an information storage electrode provided above the MOS transistor through an insulating interlayer and a counter-electrode separated from the information storage electrode due to the presence of a capacitor insulating film. In this method, the capacitor is formed by adding an impurity in a silicon oxide film which is formed on the insulating interlayer and used to shape the information storage electrode, and performing etching by using a chemical solution containing phosphoric acid, sulfuric acid, nitric acid, or a solution mixture thereof, or a chemical solution containing a solution mixture of an aqueous ammonia solution and a hydrogen peroxide solution to selectively remove the silicon oxide film added with the impurity.

6 Claims, 7 Drawing Sheets

U.S. PATENT DOCUMENTS

| | | | |
|---|---|---|---|
| 5,223,729 | * | 6/1993 | Kudoh et al. ........................ 438/397 |
| 5,300,463 | * | 4/1994 | Cathey et al. ........................ 438/756 |
| 5,384,276 | * | 1/1995 | Ogawa et al. ........................ 438/254 |
| 5,436,186 | * | 7/1995 | Hsue et al. ........................... 438/397 |
| 5,656,536 | * | 8/1997 | Wu ....................................... 438/397 |

FOREIGN PATENT DOCUMENTS

| | | | |
|---|---|---|---|
| 6130046 | | 2/1986 | (JP) ............................. H01L/21/76 |
| 1-270344 | | 10/1989 | (JP) ............................. H01L/27/10 |
| 3-232271 | | 10/1991 | (JP) ............................ H01L/27/108 |
| 5-226602 | * | 9/1993 | (JP) ....................................... 257/308 |
| 6-29463 | | 2/1994 | (JP) ............................. H01L/27/04 |
| 629463 | | 2/1994 | (JP) ............................. H01L/27/04 |
| 6-196649 | * | 7/1994 | (JP) ............................. 438/FOR 212 |

OTHER PUBLICATIONS

Wolf et al, "Chemical Vapor Deposition of Amorphous and Polycrystalline Films," Silicon Processing for the VLSI Era—vol. 1; pp. 181–182, 1986.*

Kawanago et al; "3–Dimensional Stacked Capacitor Cell for 16M and 64M Drams"; 1988; pp. 592–595; IEEE.

Kimura et al; "A New Stacked Capacitor DRAM Cell Characterized by a Storage Capacitor on a Bit–line Structure"; 1988; pp. 596–599; IEEE.

"Analysis of Isolation Degradation Induced by Interlayer Material in Capacitor Over Bit–Line (COB) DRAM Cell"; Mori et al Extended Abstracts of the 1994 International Conference on Solid State Devices and Materials, Yokohama, 1994, pp. 904–906.

* cited by examiner

METHOD OF MEASURING SEMICONDUCTOR DEVICE

BACKGROUND OF THE INVENTION

1. Field of the Invention

The present invention relates to a method of manufacturing a semiconductor device and, more particularly, to a method of forming a capacitor electrode of a semiconductor memory device.

2. Description of the Prior Art

Of semiconductor memory devices, there is a DRAM in and from which storage information can be arbitrarily input and output. In this DRAM, a memory cell constituted by one transfer transistor and one capacitor has a simple structure, so that this memory cell is widely used as one most suitable for high integration of semiconductor memory devices.

With higher integration of semiconductor devices, a capacitor having a three-dimensional structure has been developed and used for this memory cell due to the following reason. With micropatterning and an increase in density of a semiconductor element, a reduction in occupied area of a capacitor is indispensable. However, to assure the stable operation and reliability of a DRAM, a predetermined capacitance value or more is required. For this purpose, the structure of a capacitor electrode must be changed from a two-dimensional one to a three-dimensional one, thereby increasing the surface area of the capacitor electrode within a reduced occupied area.

The three-dimensional structure of the capacitor in the memory cell of the DRAM includes a stacked structure and a trenched structure. Although these structures have both merits and demerits, respectively, a capacitor having a stacked structure has a high resistance to incident α-rays or noise from, e.g., a circuit and stably operates even with a relatively small capacitance value. For this reason, the capacitor having the stacked structure is considered to be effective in a 1-gigabit DRAM in which a semiconductor element is designed on the order of about 0.15 μm.

As the capacitor having the stacked structure (to be referred to as a stacked capacitor hereinafter), fin-like capacitors and cylindrical capacitors are proposed. For example, the paper entitled "3-DIMENSIONAL STACKED CAPACITOR CELL FOR 16M AND 64M DRAMS" is contributed to INTERNATIONAL ELECTRON DEVICES MEETING, 1988, PP. 593–595, or Japanese Unexamined Patent Publication No. 1-270344 has proposed a fin-like structure of a capacitor electrode to increase the surface area of the information storage electrode of the capacitor. In addition, Japanese Unexamined Patent Publications Nos. 3-232271 and 6-29463 has made proposals in which the information storage electrodes of capacitors are formed into cylindrical structures to increase the surface areas.

A process common to the major steps of forming capacitor electrodes having three-dimensional structures such as a fin-like structure and a cylindrical structure is that a silicon oxide film (spacer film) and a material film serving as an information storage electrode are stacked and dry-etched, and then the silicon oxide film (spacer film) used to shape the information storage electrode of this capacitor is etched and removed by using a chemical solution of a hydrogen fluoride solution.

To prevent etching of an insulating interlayer below the capacitor electrode, an insulating-interlayer etching prevention layer (stopper film) must be formed between the insulating interlayer and the capacitor electrode, and particularly, the information storage electrode by using a material having an etching selectivity ratio to the silicon oxide film (spacer film). At present, a silicon nitride film whose etching rate is about 1/100 of that of a silicon oxide film in use of a hydrogen fluoride solution is widely used as this stopper film.

Figure 1A:
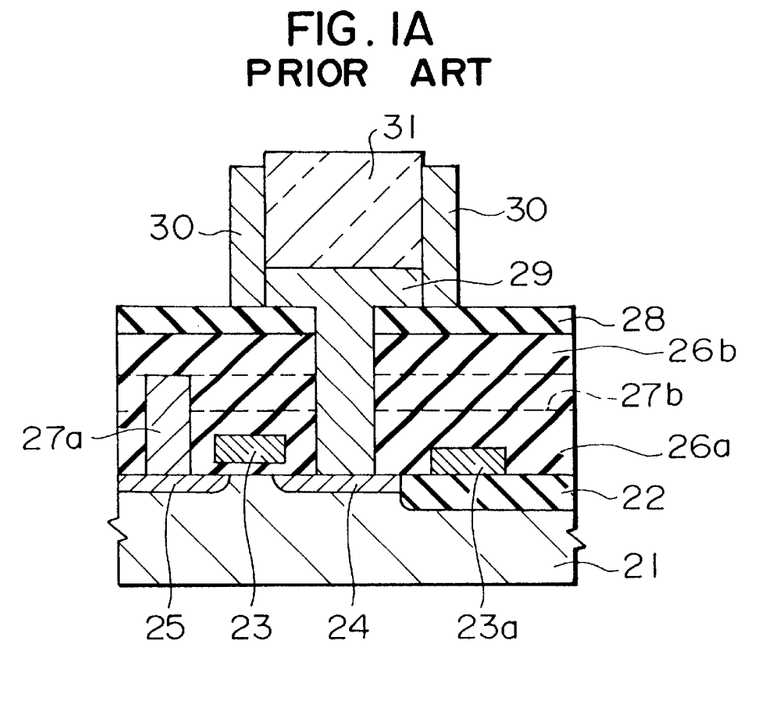
FIGS. 1A and 1B are sectional views showing the sequential manufacturing steps of a main portion to explain a prior art, respectively.
Figure 1B:
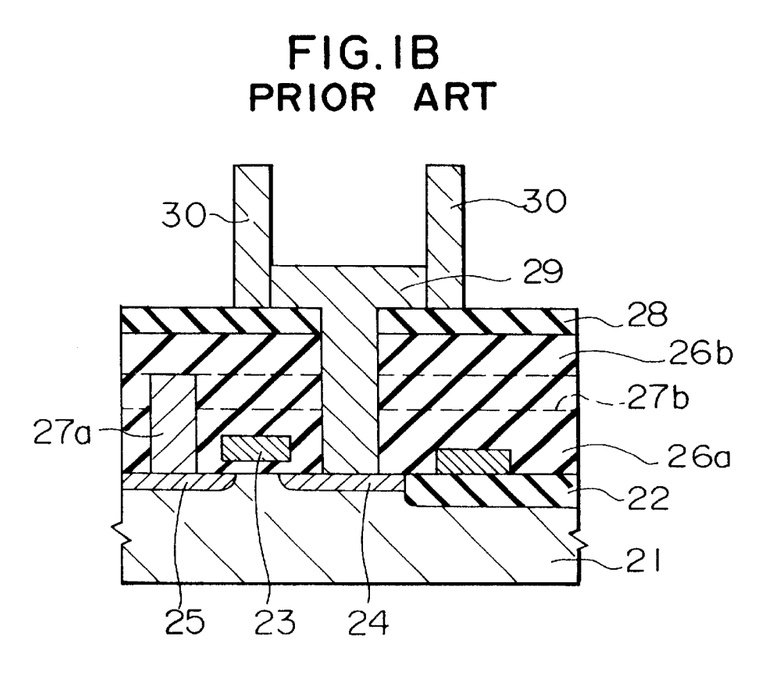

A method of forming a conventional capacitor electrode will be described below with reference to the accompanying drawings. FIGS. 1A and 1B are sectional views showing the major steps of a cylindrical electrode, respectively.

As schematically shown in FIG. 1A, a field oxide film 22 serving as an element isolation insulating film is formed on the surface of a silicon substrate 21. A gate electrode 23 which constitutes the transfer transistor of a memory cell, and a diffusion layer 24 for a capacitor and a diffusion layer 25 for a bit line which respectively serve as the source and drain regions are formed. A word line 23a is formed on the field oxide film 22. An insulating film 26a for covering the gate electrode 23 and the word line 23a is formed of a silicon oxide film or the like. A bit-line contact plug 27a is formed on the above-described diffusion layer 25 for a bit line. A bit line 27b electrically connected to the bit-line contact plug 27a is disposed, and an insulating interlayer 26b for covering the bit line 27b is deposited.

A stopper film 28 which is stacked on the insulating interlayer 26b is formed. The stopper film 28 consists of a silicon nitride film.

Then, a contact hole is formed above the above-described diffusion layer 24 for a capacitor to form a structure, as shown in FIG. 1A, which is constituted by first and second silicon films 29 and 30 serving as the information storage electrode of the capacitor and containing a phosphorus impurity, and a spacer film 31 for shaping the information storage electrode.

The spacer film 31 is selectively etched and removed with a hydrogen fluoride solution to form the information storage electrode of the capacitor, as shown in FIG. 1B.

In this manner, the gate electrode 23 of the transfer transistor, the diffusion layer 24 for a capacitor and the diffusion layer 25 for a bit line which serve as the source and drain regions, the first and second silicon films 29 and 30 which are electrically connected to the diffusion layer 24 for a capacitor and serve as the information storage electrode, and the bit line 27b electrically connected to the diffusion layer 25 for a bit line through the bit-line contact plug 27a are formed in an active region other than the field oxide film 22 on the surface of the silicon substrate 21. The first silicon film 29 is buried in the contact hole formed in the insulating interlayers 26a and 26b and the stopper film 28, and covers the surface of the stopper film 28.

When a fin-like capacitor electrode is to be formed, silicon films serving as capacitor electrodes, and spacer films as silicon oxide films for shaping the capacitor electrodes are deposited to be alternately stacked on a stopper film serving as an insulating-interlayer etching prevention layer and consisting of a silicon nitride film. These films are patterned by dry etching. Thereafter, only the spacer films are selectively etched and removed with a hydrogen fluoride solution to form the information storage electrodes of the capacitor.

When, however, the silicon nitride film is used as the insulating-interlayer etching prevention layer (stopper film), the insulating interlayer and the silicon nitride film frequently crack due to a heavy stress from the silicon nitride film, interfering with the process of manufacturing a semiconductor device. Further, since the silicon nitride film is an insulating film having a high trap density, the semiconductor device is charged up, adversely affecting its operation. In addition, since this silicon nitride film has a large blocking force with respect to permeation of hydrogen gas, annealing with hydrogen gas, which is indispensable for stabilizing the operation of the semiconductor device, cannot be sufficiently performed. As a result, the reliability and yield of the semiconductor device are reduced.

To avoid this situation, a method of decreasing the thickness of the silicon nitride film may be conceivable. However, the selectivity ratio of the silicon nitride film to the silicon oxide film is about 100:1, so that the silicon nitride film requires a film thickness of several tens nm or more. Therefore, it is difficult to decrease the thickness of the silicon nitride film to a degree enough to reduce the adverse effect.

SUMMARY OF THE INVENTION

The present invention has been made to solve the above drawbacks in the step of forming a stacked capacitor, and has as its object to provide a method of selectively removing an impurity-containing silicon oxide film used for shaping an electrode.

It is another object of the present invention to provide a method of forming capacitor electrodes having a fin-like structure and a cylindrical structure without using a silicon nitride film for insulating-interlayer etching prevention which interferes with the step of forming a semiconductor device.

In order to achieve the above objects, according to the basic aspect of the present invention, there is provided a method of manufacturing a semiconductor device having a MOS transistor formed on a silicon substrate, and a stacked capacitor constituted by an information storage electrode provided above the MOS transistor through an insulating interlayer and a counterelectrode separated from the information storage electrode due to presence of a capacitor insulating film, comprising the steps of adding an impurity in a silicon oxide film which is formed on the insulating interlayer and used to shape the information storage electrode, and performing etching by using a chemical solution containing phosphoric acid, sulfuric acid, nitric acid, or a solution mixture thereof, or a chemical solution containing a solution mixture of an aqueous ammonia solution and a hydrogen peroxide solution to selectively remove the silicon oxide film added with the impurity, thereby forming the capacitor.

In addition, in order to achieve the above objects, the present invention has the following aspects.

The insulating interlayer in the above basic aspect is a silicon oxide film containing no impurity.

The silicon oxide film containing the impurity in the above basic aspect consists of silicate glass containing boron or phosphorus, or silicate glass containing boron and phosphorus.

The capacitor having a stacked structure in the above basic aspect has a cylindrical structure or a fin-like structure.

The silicon oxide film containing the impurity in the above basic aspect is constituted by two types of silicon oxide films which are alternately deposited to form a multilayered structure.

The information storage electrode in the above basic aspect uses a thin silicon film containing phosphorus or arsenic as a material.

A phosphorus or arsenic impurity is doped in the information storage electrode after the step of performing etching by using the chemical solution to selectively remove the silicon oxide film containing the impurity.

The MOS transistor in the above basic aspect uses a thin silicon film containing a phosphorus or arsenic impurity, as an electrode material.

According to the present invention having the above aspects, a silicon nitride film conventionally used as an insulating-interlayer etching prevention layer is not required in forming a storage electrode having a three-dimensional structure. Therefore, cracking and degradation of element isolation properties with use of the silicon nitride film can be prevented, and the reliability and yield are improved.

In addition, phosphoric acid and sulfuric acid used as etching chemical solutions in the present invention have widely, generally been used in the process of manufacturing semiconductor devices, so a new manufacturing apparatus need not be developed in order to introduce the above phosphoric acid and sulfuric acid on line. The method can be put into practice at a minimum cost.

According to the method of manufacturing a semiconductor device in the present invention, since the etching selectivity ratio does not abruptly decrease, good reproducibility and high stability of the process can be obtained compared to a method using etching with a hydrogen fluoride solution.

The above and other advantages, features and additional objects of the present invention will become manifest to those versed in the art upon making reference to the following detailed description and accompanying drawings in which preferred embodiments incorporating the principle of the present invention are shown by way of illustrative example.

DETAILED DESCRIPTION OF THE PREFERRED EMBODIMENTS

A few preferred embodiments of the present invention will be described in detail below with reference to the accompanying drawings.

First of all, an embodiment of the present invention in which the memory cell of a DRAM is formed by a stacked capacitor having a cylindrical structure will be described with reference to FIGS. 2A to 2F. FIGS. 2A to 2F are sectional views schematically showing the major steps of the main part of a semiconductor device according to the first embodiment, respectively.

Figure 2A:
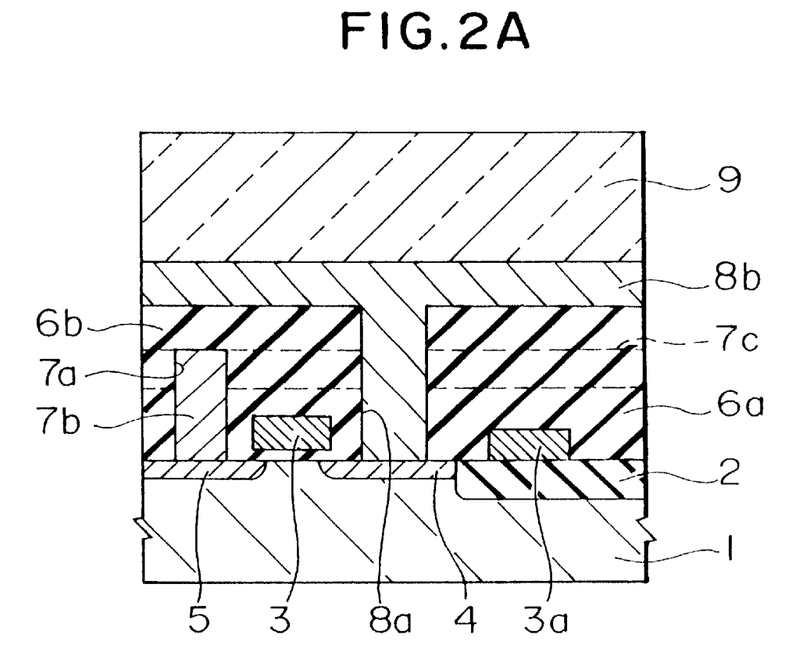
FIGS. 2A to 2F are sectional views showing the sequential manufacturing steps of a main portion to explain an embodiment of the present invention, respectively.

As shown in FIG. 2A, a field oxide film 2 serving as an inactive region is formed on a silicon substrate 1 by a conventional element isolation method such as LOCOS (LOCal Oxidation of Silicon) to form an element active region surrounded by them.

A MOS transistor constituted by a gate electrode 3, a diffusion layer 4 for a capacitor, a diffusion layer 5 for a bit line, and the like is formed on the element active region. This MOS transistor serves as the transfer transistor of the memory cell. A word line 3a is formed on the field oxide film 2. This word line 3a is connected to the gate electrode of the transfer transistor of an adjacent memory cell. An insulating interlayer 6a is formed to cover the gate electrode 3 and the word line 3a. As the insulating interlayer 6a, an HTO (High Temperature Oxide) film and a BPSG (BoroPhosphoSilicate Glass) film are sequentially formed by a well-known chemical vapor deposition (CVD) method, annealed at 750 to 900° C., and reflowed to increase the flatness.

A contact hole 7a is formed above the diffusion layer 5 for a bit line in the MOS transistor. A conductive material such as tungsten, titanium nitride, or tungsten silicide is buried in this contact hole to form a bit-line contact plug 7b. After a conductive film consisting of, e.g., tungsten is deposited, the resultant structure is patterned in a known photoetching step to form a bit line 7c.

A silicon oxide film serving as an insulating interlayer 6b for covering the bit line 7c is formed by a CVD method and planarized by a chemical machine polishing (CMP) method.

A contact hole 8a is formed above the diffusion layer 4 for a capacitor in the MOS transistor in a known photoetching step. Subsequently, a first amorphous silicon film 8b containing a phosphorus (P) impurity at a concentration of $1.5 \times 10^{20}$ atoms/cm$^3$ is formed to a film thickness of 100 to 300 nm by a known low-pressure CVD method using a gas consisting of phosphine ($PH_3$) and silane ($SiH_4$) or disilane ($Si_2H_6$).

A BPSG film serving as a spacer film 9 is formed by an atmospheric-pressure CVD method such that its film thickness is set to 300 to 600 nm. The concentration of a boron impurity contained in this BPSG film is set to 12 mol %, and the concentration of a phosphorus impurity is to 5 mol %.

Figure 2B:
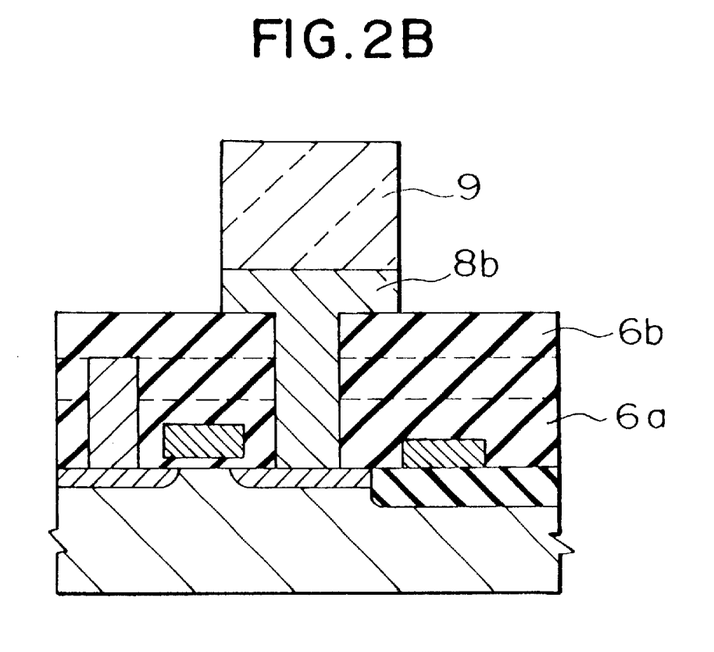

As shown in FIG. 2B, the spacer film 9 and the first silicon film 8b are processed into a predetermined shape by well-known photolithography and dry etching techniques.

Figure 2C:
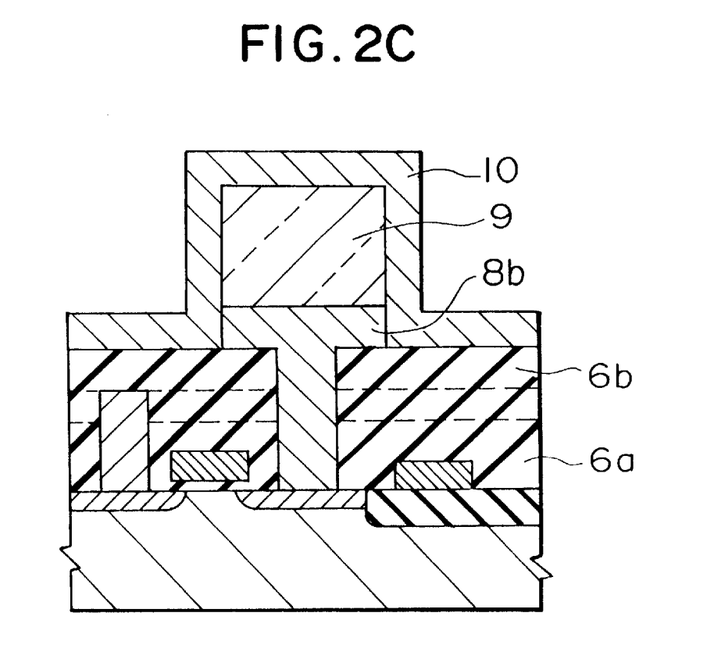

As shown in FIG. 2C, a second silicon film 10 for covering the insulating interlayer 6b, the first silicon film 8b, and the spacer film 9 is deposited. The second silicon film 10 is formed by the same method as the method of forming the first silicon film 8b, and its film thickness is set to about 100 nm.

Figure 2D:
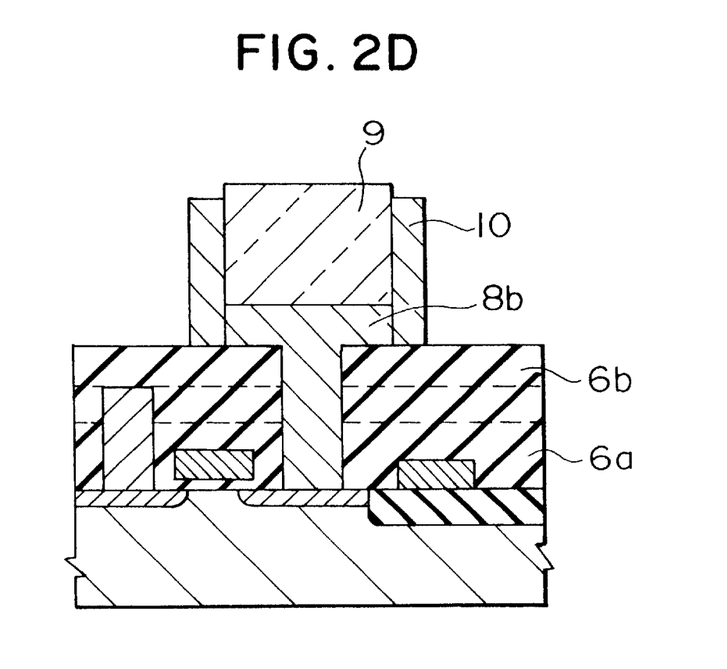

As shown in FIG. 2D, the second silicon film 10 is anisotropically dry-etched such that the second silicon film 10 remains like a side wall around the circumferential surfaces of the patterned spacer film 9 and first silicon film 8b. Accordingly, the surface of the insulating interlayer 6b is exposed. As a reaction gas for the anisotropically dry etching, a gas mixture of chlorine ($Cl_2$), oxygen ($O_2$), and hydrogen bromide (HBr) is used.

Figure 2E:
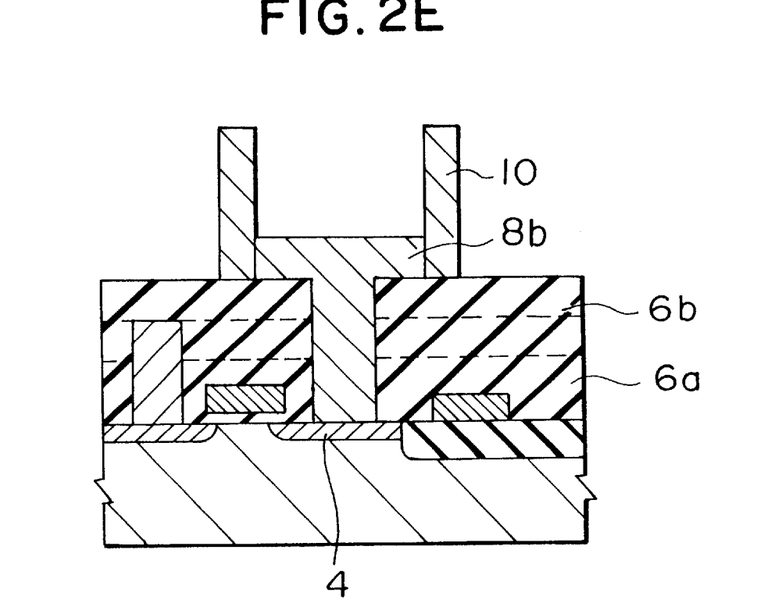

The resultant structure is dipped for 40 min in an aqueous phosphorus solution heated to 160° C. and having a concentration of 85%, thereby selectively etching and removing the spacer film 9. In this manner, a cylindrical information storage electrode is formed, as shown in FIG. 2E. This information storage electrode is constituted by the first silicon film 8b electrically connected to the diffusion layer 4 for a capacitor, and the second silicon film 10 electrically connected to the first silicon film 8b.

The etching rate of the BPSG film as the spacer film 9 was measured to obtain about 15 nm/min. It was found that the insulating interlayer 6b and the first and second silicon films 8b and 10 were etched little at that time.

Figure 2F:
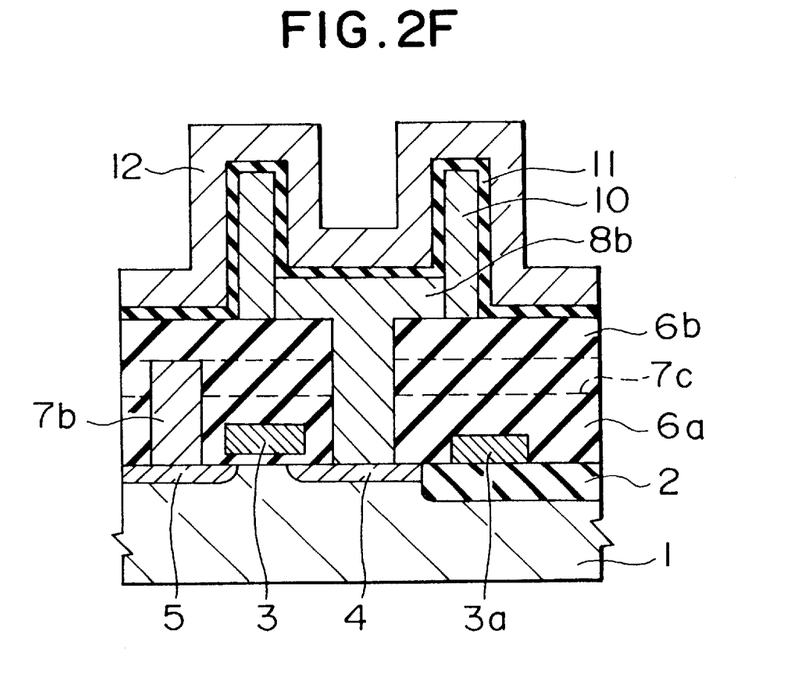

A spontaneous oxide film present on the surfaces of the first and second silicon films 8b and 10 is removed with a dilute hydrofluoric acid solution. To suppress regrowth of the spontaneous oxide film, the resultant structure is subjected to rapidly thermal nitriding in an ammonia gas atmosphere at a temperature of about 900° C. Then, as shown in FIG. 2F, a silicon nitride film is formed to a film thickness of about 50 nm by a well-known low-pressure CVD method, and thermally oxidized in a water vapor atmosphere at 800° C. to form a dielectric film 11 having an $SiO_2/Si_3N_4$ structure.

After a polysilicon film serving as an upper electrode 12 is formed to a film thickness of 150 nm, a phosphorus impurity is doped in the upper electrode 12 by well-known thermal diffusion at a temperature of about 800° C. It was found that the first and second silicon films 8b and 10 became polycrystalline at that time.

In this manner, the gate electrode 3 of the transfer transistor which constitutes a memory cell, the diffusion layer 4 for a capacitor and the diffusion layer 5 for a bit line which serve as the source and drain regions, the first and second silicon films 8b and 10 which are electrically connected to the diffusion layer 4 for a capacitor and serve as an information storage electrode, and the bit line 7c electrically connected to the diffusion layer 5 for a bit line through the bit-line contact plug 7b are formed in the active region other than the field oxide film 2 on the surface of the silicon substrate 1. The first silicon film 8b is buried in the contact hole 8a formed in the insulating interlayers 6a and 6b and covers the surface of the insulating interlayer 6b. The first silicon film 8b constitutes a stacked capacitor having a cylindrical structure, together with the capacitor insulating film 11 and the upper electrode 12 serving as a counterelectrode of the information storage electrode.

In this embodiment, the impurities contained in the first and second silicon films 8b and 10 are doped at the same time in forming these films. However, a phosphorus impurity may be thermally diffused upon forming an information storage electrode by an undoped silicon film, thereby doping the impurity in the information storage electrode.

In this embodiment, phosphorus is thermally diffused upon deposition of the undoped polysilicon film as the upper electrode 12. Alternatively, the phosphorus impurity may be doped at the same time in film formation, like the above-described method of forming an information storage electrode.

In this embodiment, the contact hole 8a and the first silicon film 8b are formed upon formation of the insulating interlayers 6a and 6b. Alternatively, the spacer film 9 may be formed on the insulating interlayers 6a and 6b, and then the contact hole 8a and the first silicon film 8b may be formed. Accordingly, a gap is formed between the insulating interlayers 6a and 6b and the first silicon film 8b upon selective etching of the spacer film 9 with the above-described chemical solution. With these steps, the lower surface of the first silicon film 8b can be effectively used as the surface of the information storage electrode.

The etching rate, of the BPSG film used as the spacer film 9 of this embodiment in use of a chemical solution increases with an increase in impurity concentration in the BPSG film. For this reason, the impurity concentration is preferably increased. However, an excess increase in impurity concentration degrades the film quality. The impurity concentration must be set within a proper concentration range.

As the spacer film 9, a silicon nitride film, a PSG (PhosphoSilicate Glass) film, or a BSG (BoroSilicate Glass) film may be used. In case of the PSG film, the concentration of the phosphorus impurity is set to 10 to 15 mol %. In case of the BSG film, the concentration of the boron impurity is set to 5 to 20 mol %.

Although the case using the heated phosphoric acid solution as a chemical solution has been described, this chemical solution may only be a chemical solution which exhibits strong oxidation properties. For example, a sulfuric acid solution, a nitric acid solution, or a solution mixture thereof can be used. Further, it was confirmed that a solution mixture of an aqueous ammonia solution and a hydrogen peroxide solution may be used as this chemical solution.

Next, the second embodiment of the present invention will be described with reference to FIGS. 3A to 3E. This embodiment is applied to formation of a stacked capacitor having a fin-like structure. FIGS. 3A to 3E are sectional views schematically showing the major manufacturing steps of the main part of a semiconductor device, respectively.

Figure 3A:
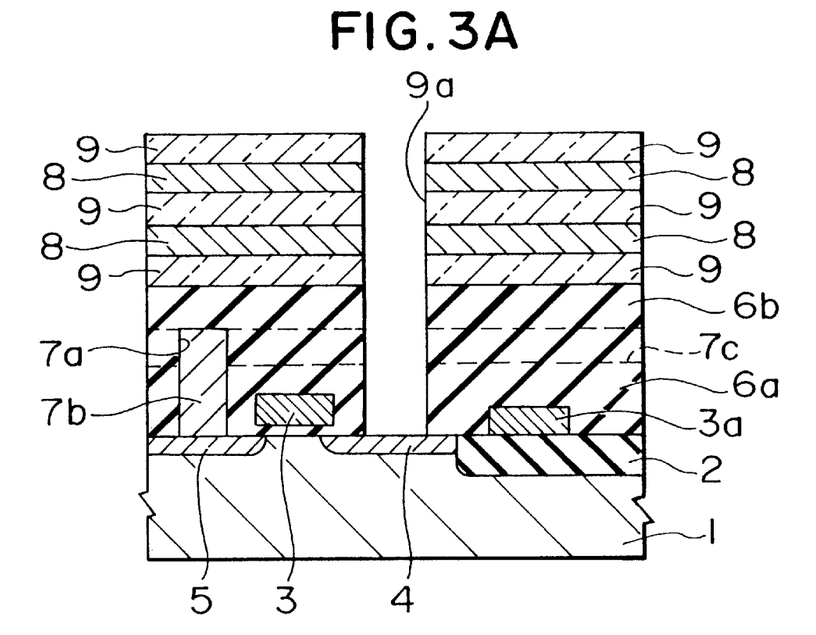
FIGS. 3A to 3E are sectional views showing the sequential manufacturing steps of a main portion to explain another embodiment of the present invention, respectively.

In the second embodiment, steps up to formation of insulating interlayers 6a and 6b shown in FIG. 3A are the same as in the first embodiment. More specifically, as shown in FIG. 3A, a field oxide film 2 serving as an inactive region is formed on a silicon substrate 1 to form an element active region surrounded by them.

A MOS transistor constituted by a gate electrode 3, a diffusion layer 4 for a capacitor, a diffusion layer 5 for a bit line, and the like is formed on the element active region. This MOS transistor serves as the transfer transistor of a memory cell. A word line 3a is formed on the field oxide film 2. This word line 3a is connected to the gate electrode of the transfer transistor of an adjacent memory cell. An insulating interlayer 6a is formed to cover the gate electrode 3 and the word line 3a. As the insulating interlayer 6a, a silicon oxide film is formed by a well-known CVD method and planarized by a CMP method.

A contact hole 7a is formed above the diffusion layer 5 for a bit line in the MOS transistor. A conductive material such as tungsten, titanium nitride, or tungsten silicide is buried in this contact hole 7a to form a bit-line contact plug 7b. After a conductive film consisting of, e.g., tungsten is deposited, the resultant structure is patterned by dry etching to form a bit line 7c.

A silicon oxide film serving as an insulating interlayer 6b for covering the bit line 7c is formed by a CVD method and planarized by a CMP method. Spacer films 9 and first silicon films 8 are alternately deposited on the insulating interlayer 6b to form a multilayered structure. Each spacer film 9 is a BSG film having a film thickness of 50 to 150 nm. The concentration of a boron impurity contained in this BSG film is set to about 15 mol %. Each first silicon film 8 is a phosphorus-doped amorphous silicon film described in the first embodiment and has a film thickness of 150 to 200 nm.

Figure 3B:
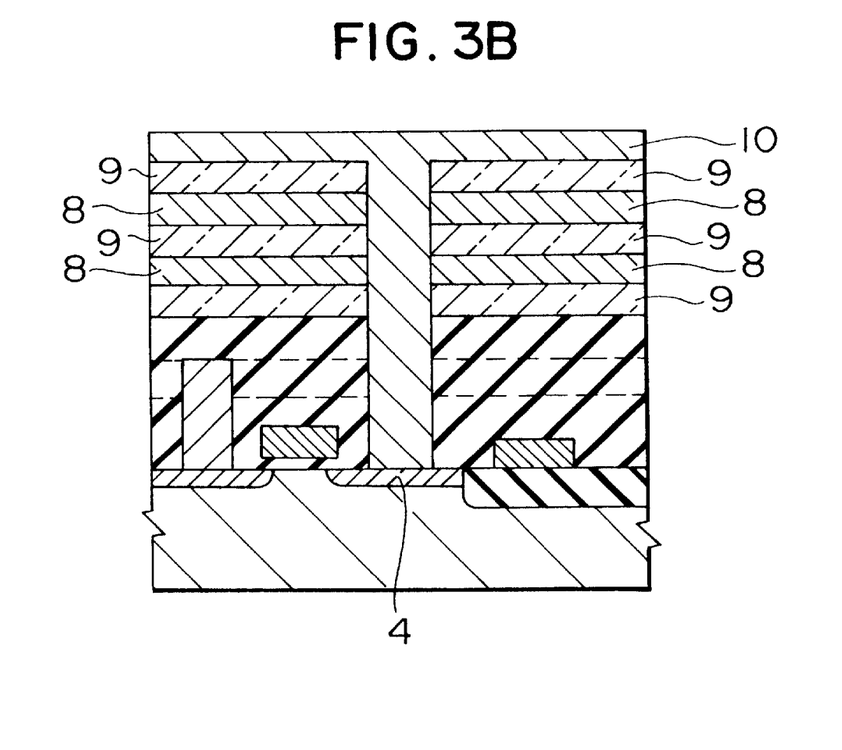
Figure 3C:
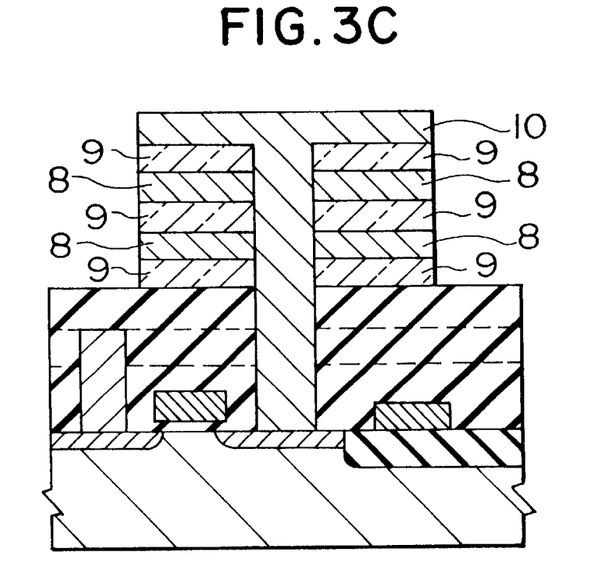

A contact hole 9a is formed above the diffusion layer 4 for a capacitor. As shown in FIG. 3B, a second silicon film 10 is deposited. The method of forming the second silicon film 10 is the same as that described in the first embodiment. Then, as shown in FIG. 3C, the spacer films 9, the first silicon films 8, and the second silicon film 10 are processed into a predetermined shape by dry etching.

Figure 3D:
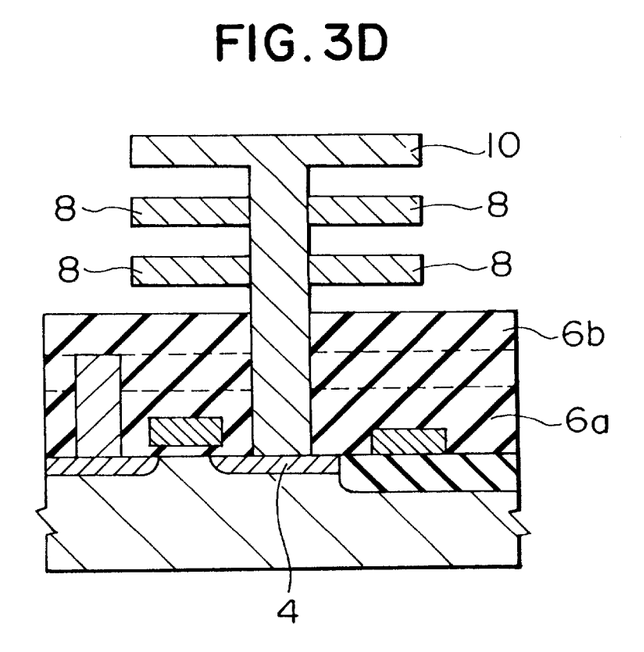

The resultant structure is dipped for 120 min in a concentrated sulfuric acid solution heated to 120 to 140° C. and having a concentration of about 90% to selectively etch and remove the spacer films 9. In this manner, a fin-like information storage electrode having three fins is formed, as shown in FIG. 3D. This information storage electrode is constituted by the above-described first and second silicon films 8 and 10.

In etching with this chemical solution, the etching rate of the spacer films 9 was about 9 nm/min when the temperature of the concentrated sulfuric acid solution was 140° C. The etching rate of the silicon oxide films constituting the insulating interlayers 6a and 6b was about 0.3 nm/min though the silicon films were etched little. The insulating interlayers 6a and 6b are etched by about 30 to 40 nm during processing for 120 min, but no problem arises.

Figure 3E:
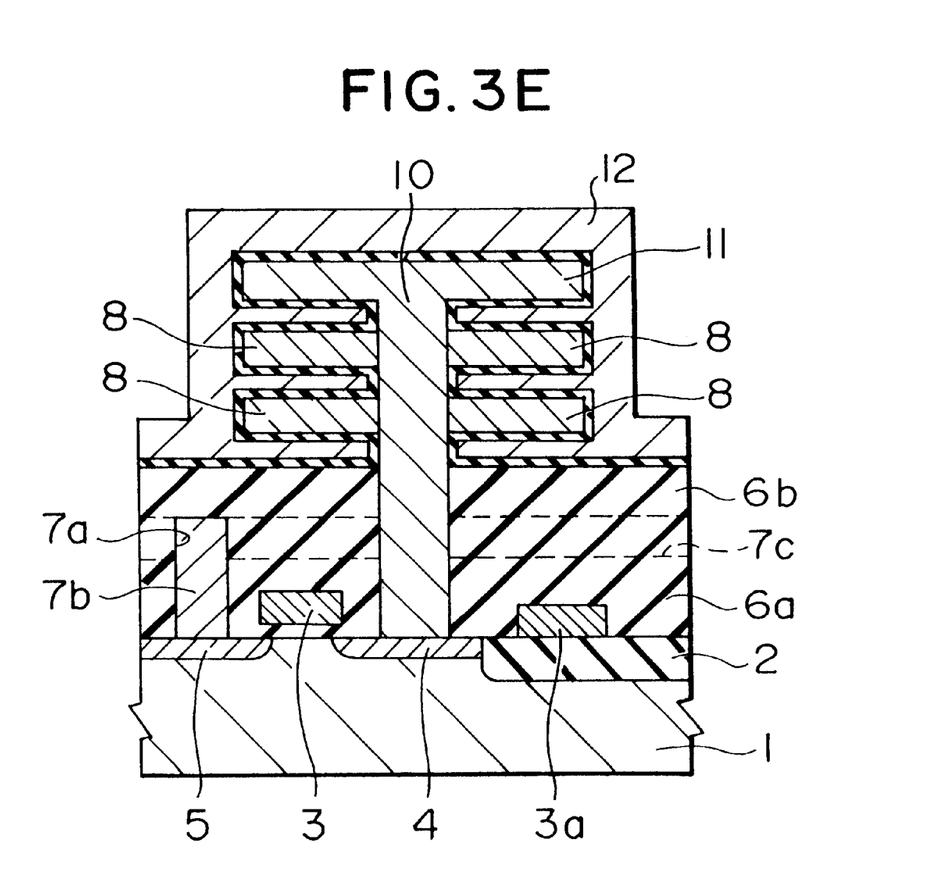

Next, as described in the first embodiment, a spontaneous oxide film present on the surfaces of the first and second silicon films 8 and 10 is removed with a dilute hydrofluoric acid solution. To suppress regrowth of the spontaneous oxide film, the resultant structure is subjected to rapidly thermal nitriding in an ammonia gas atmosphere at a temperature of about 900° C. Then, as shown in FIG. 3E, a silicon nitride film is formed to a film thickness of about 70 nm by a well-known low-pressure CVD method, and thermally oxidized in a water vapor atmosphere at 800° C. to form a dielectric film 11 having an $SiO_2/Si_3N_4$ structure. In this thermal oxidization step, the first and second silicon films 8 and 10 become polycrystalline.

After a polysilicon film serving as an upper electrode 12 is formed to a film thickness of 150 nm, a phosphorus impurity is doped in the upper electrode 12 by well-known thermal diffusion.

In this manner, the gate electrode 3 of the transfer transistor which constitutes a memory cell, the diffusion layer 4 for a capacitor and the diffusion layer 5 for a bit line which serve as the source and drain regions, the first and second silicon films 8 and 10 which are electrically connected to the diffusion layer 4 for a capacitor and serve as an information storage electrode, and the bit line 7c electrically connected to the diffusion layer 5 for a bit line through the bit-line contact plug 7b are formed in the active region other than the field oxide film 2 on the surface of the silicon substrate 1. The second silicon film 10 is buried in the contact hole 9a formed in the insulating interlayers 6a and 6b and covers the surface of the insulating interlayer 6b. The second silicon film 10 constitutes a stacked capacitor having a fin-like structure, together with the capacitor insulating film 11 and the upper electrode 12 serving as a counterelectrode of the information storage electrode.

In this embodiment, the structure has three fins, but a structure having three or more fins, or three or less fins can be formed in the same manner. In this case, the first silicon film 8 or the second silicon film 10 may consist of impurity-containing polysilicon.

This embodiment exemplifies the case in which the BSG film is used as the spacer film. If a BPSG film or a PSG film is used as this spacer film, the same effect can be obtained. Further, it is noted that a phosphoric acid solution, or a solution mixture of an aqueous ammonia solution and a hydrogen peroxide solution may be used as the etching chemical solution.

In the above embodiments, the stacked capacitors having a cylindrical structure and a fin-like structure have been described. It is noted that a capacitor having another structure can also be formed by using the chemical solution and spacer film of the present invention The case using the silicon oxide film as an insulating interlayer has been described. In addition, it is noted that a silicon oxide film excessively containing silicon atoms may be used as the insulating film.

What we claimed is:

1. A method of manufacturing a semiconductor device having a MOS transistor formed on a silicon substrate, wherein a stacked capacitor constituted by an information storage electrode is provided above said MOS transistor through an impurity-free silicon oxide film insulating interlayer and a counterelectrode separated from said information storage electrode by a capacitor insulating film, comprising the steps of:

(1) adding an impurity to a silicon oxide film which is formed on said insulating interlayer and used to shape said information storage electrode;

(2) performing etching of said impurity-containing silicon oxide film using a chemical etching solution consisting of an aqueous solution of, sulfuric acid, nitric acid, or a solution mixture thereof, to selectively remove said impurity-containing silicon oxide film while leaving said impurity-free silicon oxide film little etched, thereby forming said information storage electrode; and (3) subjecting the resulting electrode from step (2) to thermal nitriding to suppress regrowth of a spontaneous oxide film.

2. A method of forming a semiconductor device, comprising:

forming phosphorus doped amorphous silicon film on an interlayer insulating film;

forming an impurity doped silicon glass film on said silicon film;

patterning said silicon film and said impurity doped silicon glass film to form a lower capacitor electrode and patterned impurity doped silicon glass film, respectively; and removing said patterned impurity doped silicon glass film, by using an etchant selected from the group consisting of phosphoric acid, sulfuric acid and nitric acid.

3. The method as claimed in claim 2, the method further comprising:

annealing in a nitrogen atmosphere, after said patterned impurity doped silicon glass film is removed.

4. The method as claimed in claim 3, wherein said impurity doped silicon glass film is a BPSG film.

5. The method as claimed in claim 3, wherein said impurity doped silicon glass film is a BSG film.

6. The method as claimed in claim 3, wherein said impurity doped silicon glass film is a PSG film.

* * * * *